(12) United States Patent
Fujikawa

(10) Patent No.: US 11,586,080 B2
(45) Date of Patent: Feb. 21, 2023

(54) ACTIVE MATRIX SUBSTRATE AND DISPLAY PANEL

(71) Applicant: SHARP KABUSHIKI KAISHA, Sakai (JP)

(72) Inventor: Yohsuke Fujikawa, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 17/477,469

(22) Filed: Sep. 16, 2021

(65) Prior Publication Data

US 2022/0004044 A1 Jan. 6, 2022

Related U.S. Application Data

(63) Continuation of application No. 16/492,785, filed as application No. PCT/JP2018/009171 on Mar. 9, 2018, now Pat. No. 11,150,525.

(30) Foreign Application Priority Data

Mar. 17, 2017 (JP) .................................. 2017-052171

(51) Int. Cl.
*G02F 1/1345* (2006.01)
*G02F 1/1343* (2006.01)
(Continued)

(52) U.S. Cl.
CPC ........ *G02F 1/13458* (2013.01); *G02F 1/1368* (2013.01); *G02F 1/134336* (2013.01); *G02F 1/136286* (2013.01); *H01L 27/124* (2013.01)

(58) Field of Classification Search
None
See application file for complete search history.

(56) References Cited

U.S. PATENT DOCUMENTS

2005/0057467 A1* 3/2005 Fujita .................. G09G 3/3648
345/87
2012/0146972 A1 6/2012 Fujikawa
(Continued)

FOREIGN PATENT DOCUMENTS

JP S61-003126 A 1/1986
JP H11-305681 A 11/1999
(Continued)

OTHER PUBLICATIONS

Notice of Allowance dated Jun. 10, 2021 for the parent U.S. Appl. No. 16/492,785.

*Primary Examiner* — Thanh Nhan P Nguyen
(74) *Attorney, Agent, or Firm* — ScienBiziP, P.C.

(57) ABSTRACT

An active matrix substrate includes a glass substrate 26, a plurality of pixel electrodes 40 arrayed in a matrix, a plurality of TFTs 43, a plurality of common electrodes 42, a terminal group 60 provided at one end of a Y-axis direction on top of the glass substrate 26 and constituted by a plurality of terminals 61 and 62 placed along an X-axis direction, wires 71 that electrically connect the terminals 61 to the TFTs 43, and wires 72 that electrically connect the terminals 62 to the common electrodes 42. The terminal group 60 includes a center terminal group 64, constituted by a plurality of the first terminals 61, that constitutes a center portion of the terminal group 60 in the X-axis direction, and end terminal groups 65L and 65R, each constituted by a plurality of the first terminals and a plurality of the second terminals, that constitute both side portions, respectively, of the terminal group 60 in the X-axis direction and in each of which the second terminals 62 are each disposed between two of the first terminals 61 adjacent to each other.

22 Claims, 11 Drawing Sheets

(51) Int. Cl.
*G02F 1/1362* (2006.01)
*G02F 1/1368* (2006.01)
*H01L 27/12* (2006.01)

(56) References Cited

U.S. PATENT DOCUMENTS

| | | |
|---|---|---|
| 2013/0328807 A1 | 12/2013 | Matsumoto |
| 2015/0234532 A1 | 8/2015 | Matsumoto |
| 2016/0313856 A1 | 10/2016 | Matsumoto |
| 2017/0205951 A1 | 7/2017 | Matsumoto |
| 2018/0095594 A1 | 4/2018 | Matsumoto |
| 2019/0155442 A1 | 5/2019 | Matsumoto |

FOREIGN PATENT DOCUMENTS

| | | |
|---|---|---|
| JP | 2005-084535 A | 3/2005 |
| JP | 2005-092185 A | 4/2005 |
| JP | 2013-254168 A | 12/2013 |

\* cited by examiner

ACTIVE MATRIX SUBSTRATE AND DISPLAY PANEL

TECHNICAL FIELD

The present invention relates to an active matrix substrate and a display panel.

BACKGROUND ART

Conventionally, a display device including a display panel such as a liquid crystal panel has been used in a portable information terminal apparatus such as a mobile phone, a smartphone, or a tablet laptop personal computer or an electronic apparatus such as a computer. The display panel is constituted by an active matrix substrate including pixels arrayed in a matrix and terminals placed along a side of the active matrix substrate and connected to wires drawn out from the respective pixels. Known examples of modes of placement of terminals pertaining to active matrix substrates include those described in PTLs 1 to 5 listed below.

PTL 1 describes a plurality of terminals configured such that the pitch between terminals disposed at an end of an array direction is larger than the pitch between terminals disposed in a central part of the array direction. PTL 2 describes a configuration in which the area of a terminal disposed at an end of an array direction and the pitch between such terminals are larger than the area of a terminal disposed in a central part of the array direction and the pitch between such terminals. PTL 3 describes a configuration in which terminals connected to source bus lines, terminals connected to gate bus lines, and terminals connected to a common electrode are arrayed along a side of an active matrix substrate. Further, in PTL 3, the terminals connected to the source bus lines are divided into three terminal groups, and terminal groups connected to the gate bus lines are disposed closer to the outside than terminal groups connected to the source bus lines. PTL 4 describes a configuration in which terminals connected to source bus lines and terminals connected to gate bus lines are formed on a side on an active matrix substrate and alternately disposed in a direction along the side.

Note here that the modes of placement of terminals in the active matrix substrates described in PTLs 1 to 4 are summarized in (1) to (3) as follows:
(1) The plurality of terminals are basically arrayed at equal spacings and have the same area.
(2) Some of the plurality of terminals may be arrayed at a larger pitch for higher mounting accuracy or made larger in area for lower resistance.
(3) In a case where a plurality of terminals having different functions are arrayed, the plurality of terminals are grouped into terminal groups for each separate function, and one terminal group may be interposed between other terminal groups. Further, terminals having different functions may be alternately arrayed in a direction along a side of a substrate.

Further, PTL 5 describes an in-cell liquid crystal display panel containing a touch panel function and describes a configuration in which terminals connected to source bus lines, terminals connected to gate bus lines, and terminals connected to common electrodes are formed on a side of an active matrix substrate. In such an active matrix substrate containing a touch panel function as that described in PTL 5, the common electrodes are configured to be divided so that a touch position can be detected.

RELATED ART DOCUMENT

Patent Literature

PTL 1: Japanese Unexamined Patent Application Publication No. 61-3126
PTL 2: Japanese Unexamined Patent Application Publication No. 2005-92185
PTL 3: Japanese Unexamined Patent Application Publication No. 2005-84535
PTL 4: Japanese Unexamined Patent Application Publication No. 11-305681
PTL 5: Japanese Unexamined Patent Application Publication No. 2013-254168

Problem to be Solved by the Invention

Recently, the display devices have been required to have higher resolution and narrower frames. For this reason, the modes of placement of terminals have been required to achieve narrower frames while coping with increases in the number of terminals entailed by increases in resolution of the display devices. In particular, in such an active matrix substrate containing a touch panel function as that described in PTL 5, it is necessary to provide, in addition to the terminals connected to the wires drawn out from the pixels, terminals connected to wires drawn out from the respective common electrodes. This causes an increase in the total number of terminals, thus making it more difficult to achieve a narrower frame and causing an increase in outer shape of the display panel. An increase in outer shape of the display panel raises concern about restrictions on design and increases in manufacturing cost.

DISCLOSURE OF THE PRESENT INVENTION

The present invention was made in view of the above circumstances. An object is to make an active matrix substrate have a narrower frame.

Means for Solving the Problem

In order to solve the foregoing problems, an active matrix substrate of the present invention includes: a substrate; a plurality of pixel electrodes disposed on top of the substrate and arrayed in a matrix along a row direction and a column direction; a plurality of switching elements disposed on top of the substrate and connected to the plurality of pixel electrodes, respectively; a plurality of common electrodes disposed on top of the substrate; a terminal group disposed at an end of the substrate in the column direction on top of the substrate and constituted by a plurality of first terminals and a plurality of second terminals placed along the row direction, a length of the terminal group in the row direction being set to be smaller in value than a length of a region of placement of the plurality of switching elements in the row direction and a region of placement of the plurality of common electrodes in the row direction; a plurality of switching element wires, disposed on top of the substrate, that electrically connect the first terminals to a plurality of the switching elements placed in the column direction, the plurality of switching element wires being disposed in correspondence with the plurality of first terminals, respectively; and a plurality of common electrode wires, disposed on top of the substrate, that electrically connect the plurality of second terminals to the plurality of common electrodes, respectively. The terminal group includes a center terminal group, constituted by a plurality of the first terminals placed along the row direction, that constitutes a center portion of the terminal group in the row direction, and end terminal groups, each constituted by a plurality of the first terminals placed along the row direction and a plurality of the second terminals placed along the row direction, that constitute both side portions, respectively, of the terminal group in the row direction and in each of which the second terminals are each disposed between two of the first terminals adjacent to each other in the row direction.

In a case where from each of a plurality of electrodes (or switching elements) placed in the row direction, a wire is extended with respect to each terminal of a terminal group that is relatively small in length in the row direction, a plurality of the wires are disposed in such a manner as to converge toward the terminal group. Note here that since an increase in degree of convergence of the wires leads to an increase in length of the wires in the row direction, a larger number of wires are placed in the column direction. When a large number of wires are placed in the column direction, there is an increase in space of placement of the wires in the column direction due to the width of each wire and the spacing between adjacent wires. According to the foregoing configuration, the end terminal groups, which constitute both side portions of the terminal group in the row direction, are each configured to include second terminals each disposed between two adjacent first terminals. That is, the end terminal groups are each configured to include a mixture of first and second terminals. As a result, the length of the plurality of first terminals in the row direction and the length of the plurality of second terminals in the row direction can be made larger than in a case where the terminal group has its central portion constituted solely by first terminals and both end portions of the terminal group are each constituted solely by second terminals. That is, the degree of convergence of the plurality of switching element wire and the degrees of convergence of the plurality of common electrode wires can each be made smaller. This as a result makes it possible to further reduce the space of placement of the switching element wires and the common electrode wires in the column direction, thus making it possible to make the active matrix substrate have a narrower frame.

Further, the active matrix substrate may further include third terminal groups provided on top of the substrate, disposed on both sides, respectively, of the terminal group in the row direction, and each constituted by a plurality of third terminals placed along the row direction. In the foregoing configuration, the length of the terminal group in the row direction is set to be smaller in value than the length of the region of placement of the plurality of switching elements and the region of placement of the plurality of common electrodes. This makes it possible to secure a space in which to place terminals on both sides of the terminal group in the row direction. This makes it possible to prevent the active matrix substrate from becoming larger in the row direction in a case where the third terminals, which are terminals other than the first and second terminals, are disposed.

Further, the switching element wires may be electrically connected to source electrodes of the switching elements, and the third terminals may be electrically connected to gate electrodes of the switching elements. Such a configuration allows the terminals connected to the switching elements and the common electrodes to be arrayed along the row direction, thus making it possible to further reduce the space of placement of the terminals in the column direction.

Next, in order to solve the foregoing problems, a display panel of the present invention includes: the active matrix substrate described above; and a counter substrate placed opposite the active matrix substrate. According to the display panel thus configured, the active matrix substrate has a narrower frame, so that the display panel is excellent in design.

Advantageous Effect of the Invention

The present invention makes it possible to make an active matrix substrate have a narrower frame.

MODES FOR CARRYING OUT THE INVENTION

First Embodiment

Figure 1:
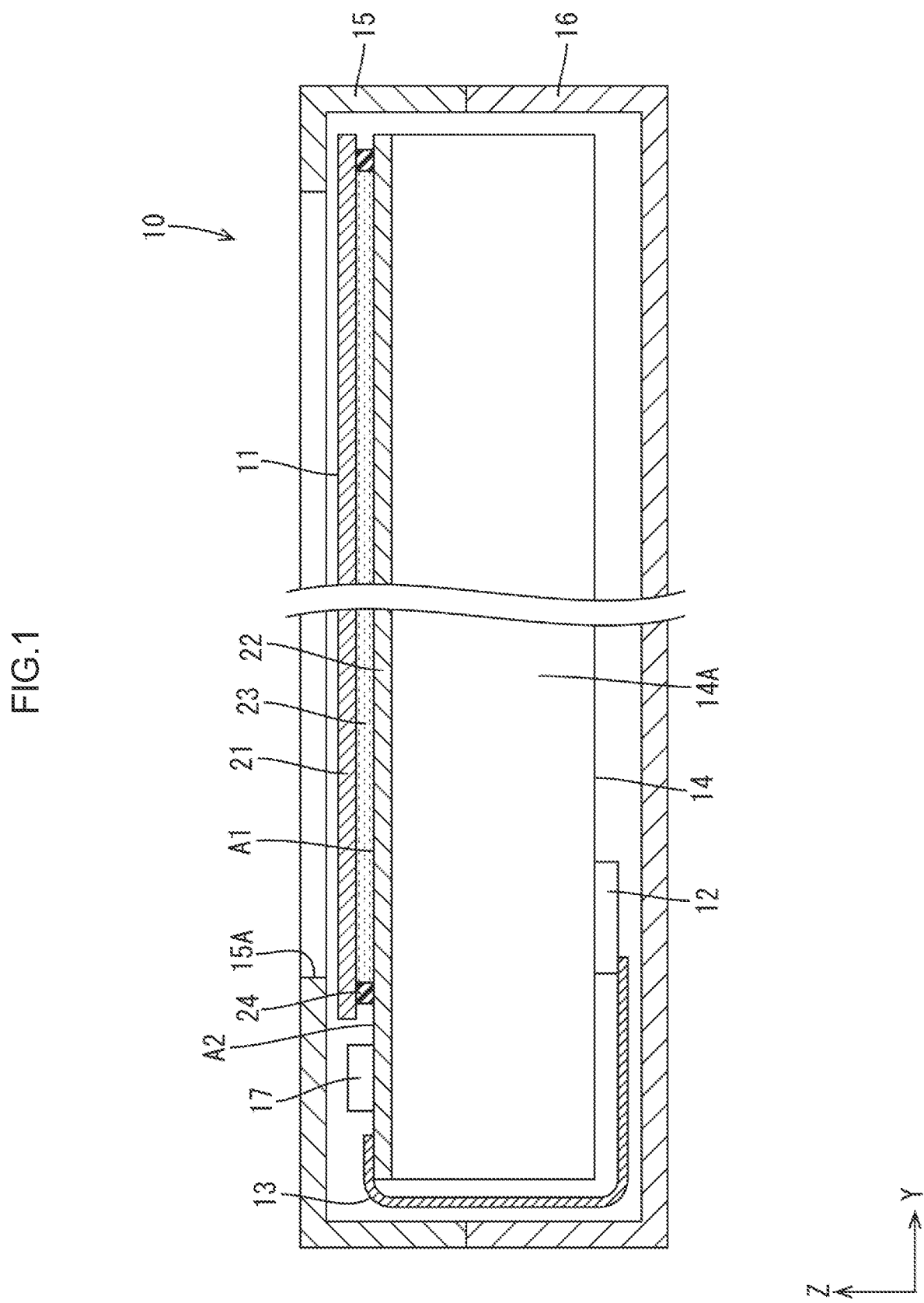
FIG. 1 is a cross-sectional view of a liquid crystal display device according to a first embodiment of the present invention as taken along a cutting-plane line extending along a Y-axis direction.

A first embodiment of the present invention is described with reference to FIGS. 1 to 10. It should be noted that some of the drawings show an X axis, a Y axis, and a Z axis and are drawn so that the direction of each axis is an identical direction in each drawing. As shown in FIG. 1, a liquid crystal display device 10 includes a liquid crystal panel 11 (display panel), a driver 17 (panel driving unit) that drives the liquid crystal panel 11, a control circuit board 12 (external signal supply source) that externally supplies the driver 17 with various types of input signal, a flexible substrate 13 (external connecting component) that electrically connects the liquid crystal panel 11 to the external control circuit board 12, and a backlight device 14 (lighting device) serving as an external light source that supplies the liquid crystal panel 11 with light. As shown in FIG. 1, the backlight device 14 includes a chassis 14A having a substantially boxed shape opening toward the front (i.e. toward the liquid crystal panel 11), a light source (such as a cold-cathode tube, an LED, or organic EL; not illustrated) disposed inside the chassis 14A, and an optical member (not illustrated) disposed in such a manner as to cover the opening of the chassis 14A. The optical member has a function of, for example, converting light emitted from the light source into planar light.

Further, as shown in FIG. 1, the liquid crystal display device 10 includes a pair of front and back exterior members 15 and 16 assembled to each other to accommodate and hold the liquid crystal panel 11 and the backlight device 14, and of these exterior members 15 and 16, the front exterior member 15 has an opening 15A through which to see from outside an image displayed on a display region A1 of the liquid crystal panel 11. According to the present embodiment, the liquid crystal display device 10 is used, for example, in various types of electronic apparatus (not illustrated) such as mobile phones (including smartphones), laptop personal computers (including tablet laptop personal computers), wearable terminals (including smartwatches), portable information terminals (including electronic books and PDAs), portable game machines, and digital photo frames.

As shown in FIG. 1, the liquid crystal panel 11 includes a pair of substrates 21 and 22 disposed opposite each other, a liquid crystal layer 23 (medium layer), disposed between the two substrates 21 and 22, that contains liquid crystal molecules constituting a substance whose optical properties vary in the presence of the application of an electric field, and a sealing member 24, disposed between the two substrates 21 and 22, that seals in the liquid crystal layer 23 by surrounding the liquid crystal layer 23. Of the two substrates 21 and 22, the front (front side, upper side of FIG. 1) substrate serves as CF substrate 21 (counter substrate), and the back (rear side) substrate serves as an active matrix substrate 22 (array substrate, element-side substrate). It should be noted that although the liquid crystal molecules contained in the liquid crystal layer 23 are aligned, for example, in a horizontal direction, this is not intended to impose any limitation. Further, polarizing plates (not illustrated) are pasted to outer surfaces of the two substrates 21 and 22, respectively.

The CF substrate 21 is constituted by a color filter, an overcoat film, and an alignment film (none of which is illustrated) being stacked over an inner surface (facing the liquid crystal layer 23) of a glass substrate (not illustrated). The color filter includes three colored portions (not illustrated) of R (red), G (green), and B (blue) arrayed in a matrix. Each of the colored portions is placed opposite a corresponding one of pixels (see FIG. 4) of the active matrix substrate 22.

Figure 3:
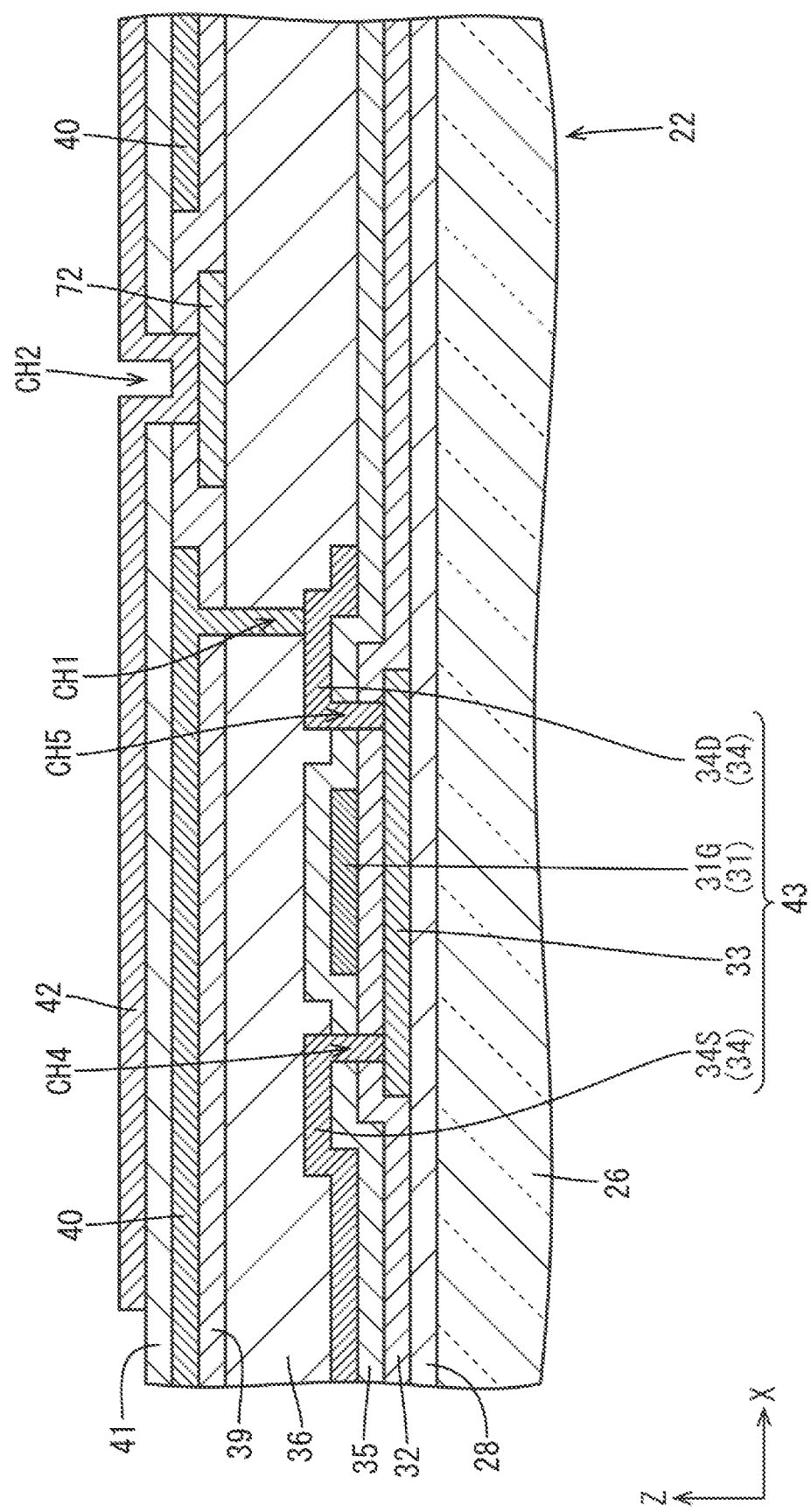
FIG. 3 is a cross-sectional view showing an active matrix substrate in a display region.

As shown in FIG. 3, the active matrix substrate 22 includes a glass substrate 26 (substrate) and various types of films stacked over an inner surface (facing the liquid crystal layer 23, upper side of FIG. 3) of the glass substrate 26. Specifically, a basecoat film 28, a semiconductor film 33, a gate insulating film 32, a gate conducting film 31, an insulating film 35, a conducting film 34, a planarizing film 36, a wire 72, an insulating film 39, a pixel electrode 40, an insulating film 41, and a common electrode 42 are formed to be stacked on top of the glass substrate 26 in this order from the bottom. The basecoat film 28 takes the form of a solid pattern that entirely covers the surface of the glass substrate 26, and is composed of, for example, silicon dioxide ($SiO_2$), silicon nitride (SiNx), silicon nitroxide (SiNO), or the like. The semiconductor film 33 is stacked at a higher level than the basecoat film 28, and constitutes a channel portion (semiconductor portion) that is connected to a source electrode 34S and a drain electrode 34D in a TFT 43. The semiconductor film 33 is composed of low-temperature polysilicon (LTPS).

The gate insulating film 32 is stacked at a higher level than the basecoat film 28 and the semiconductor film 33. The gate conducting film 31 is constituted by a single-layer film composed of one type of metal material (such as tantalum or tungsten), a laminated film composed of different types of metal material, an alloy, or the like, and has electric conductivity and a light blocking effect. The gate conducting film 31 constitutes gate lines 31A (see FIG. 4), a gate electrode 31G of the TFT 43, and the like. That is, the gate lines 31A and the gate electrode 31G are disposed on the same level. The insulating film 35 is stacked at a higher level than the gate insulating film 32 and the gate conducting film 31. The conducting film 34 is stacked at a higher level than the insulating film 35, is constituted by a single-layer film composed of one type of metal material (such as aluminum (Al) or chromium (Cr)), a laminated film composed of different types of metal material, an alloy, or the like, and has electric conductivity and a light blocking effect. The conducting film 34 constitutes source lines 34A (see FIG. 2), the source electrode 34S and drain electrode 34D of the TFT 43, and the like. That is, the conducting film 34 can be called "source conducting film" and "drain conducting film", and the source lines 34A, the source electrode 34S, the drain electrode 34D are disposed on the same level.

The planarizing film 36 is stacked at a higher level than the conducting film 34 and the insulating film 35, and is composed, for example, of an acrylic resin material (such as polymethacrylate resin (PMMA)) that is an organic resin material. The planarizing film 36 is an organic insulating film that is thicker in film thickness than other inorganic insulating films (insulating films 32, 35, 39, and 41), and has a function of planarizing a surface. The wire 72 is composed, for example, of copper (Cu), titanium (Ti), molybdenum (Mo), aluminum (Al), magnesium (Mg), cobalt (Co), chromium (Cr), tungsten (W), or a mixture thereof. The insulating film 39 is stacked at a higher level than the planarizing film 36 and the wire 72.

The pixel electrode 40 is disposed on top of the insulating film 39, and is constituted by a film such as a transparent electrode material (such as ITO (indium tin oxide)). The insulating film 41 is stacked at a higher level than the pixel electrode 40 and the insulating film 39. The common electrode 42 is disposed on top of the insulating film 41, and is constituted by a film made of a transparent electrode material (such as ITO) or the like. The gate insulating film 32, the insulating film 35, the insulating film 39, and the insulating film 41 are inorganic insulating films composed of an inorganic material such as silicon nitride (SiNx) or silicon dioxide ($SiO_2$), and have moisture-proof properties.

Further, in the display region A1, the TFT 43, which is a switching element, is provided in correspondence with the pixel electrode 40. The TFT 43 includes the gate electrode 31G, the semiconductor film 33, the source electrode 34S, and the drain electrode 34D. In a place on the planarizing film 36 and the insulating film 39 that overlaps the drain electrode 34D, a contact hole CH1 is formed in such a manner as to be bored through the planarizing film 36 and the insulating film 39. The pixel electrode 40 is connected to the drain electrode 34D via the contact hole CH1. In a place on the insulating films 39 and 41 that overlaps the wire 72, a contact hole CH2 is formed in such a manner as to be bored through the insulating films 39 and 41. The contact hole CH2 opens toward the liquid crystal layer 23 (i.e. upward in FIG. 3), and the common electrode 42 is connected to the wire 72 via the contact hole CH2. Further, contact holes CH4 and CH5 are formed in such a manner as to be bored through the gate insulating film 32 and the insulating film 35, respectively. The source electrode 34S is connected to the semiconductor film 33 via the contact hole CH4. The drain electrode 34D is connected to the semiconductor film 33 via the contact hole CH5.

Figure 2:
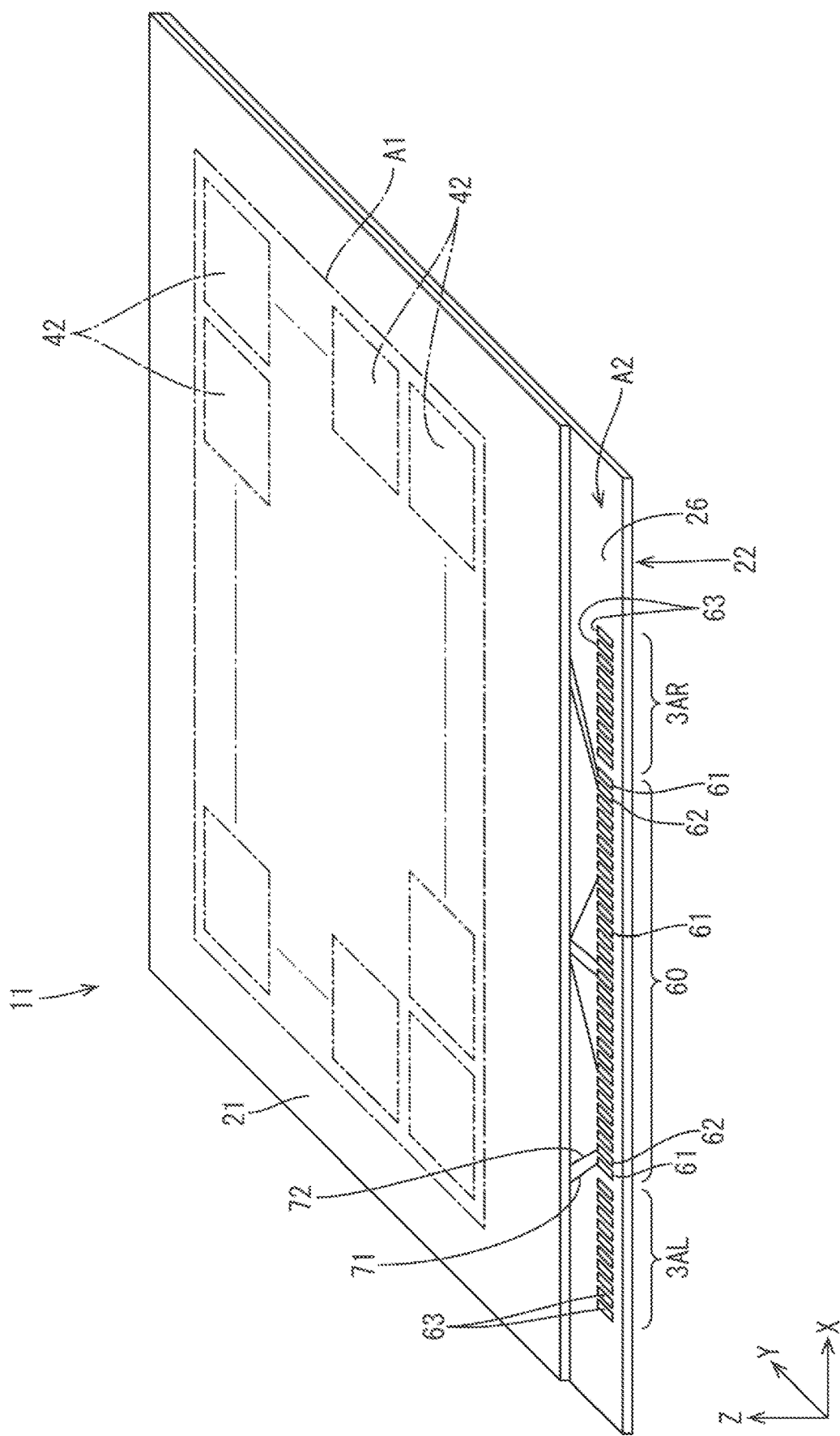
FIG. 2 is a perspective view showing a liquid crystal panel.

As shown in FIG. 2, the liquid crystal panel 11 has the display region A1, which is capable of displaying an image, and a non-display region A2 disposed on an outer circumferential side in such a manner as to surround the display region A1. The display region A1 is formed in an inner portion of a region where the CF substrate 21 and the active matrix substrate 22 overlap. The CF substrate 21 and the active matrix substrate 22 each have a square shape, and the active matrix substrate 22 projects from the CF substrate 21 toward one side in a Y-axis direction. As a result, one peripheral end of the active matrix substrate 22 in the Y-axis direction is a region that does not overlap the CF substrate 21, and in this region, terminals 61, 62, and 63 (which will be described in detail later) are formed. To the terminals 61, 62, and 63, for example, circuit members such as the driver 17 and the flexible substrate 13 are connected as appropriate. It should be noted that the driver 17 may be mounted on top of the flexible substrate 13 (COF mounting), and in that case, each terminal (mainly the terminals 61 and 62) are connected to the driver 17 via the flexible substrate 13.

Figure 4:
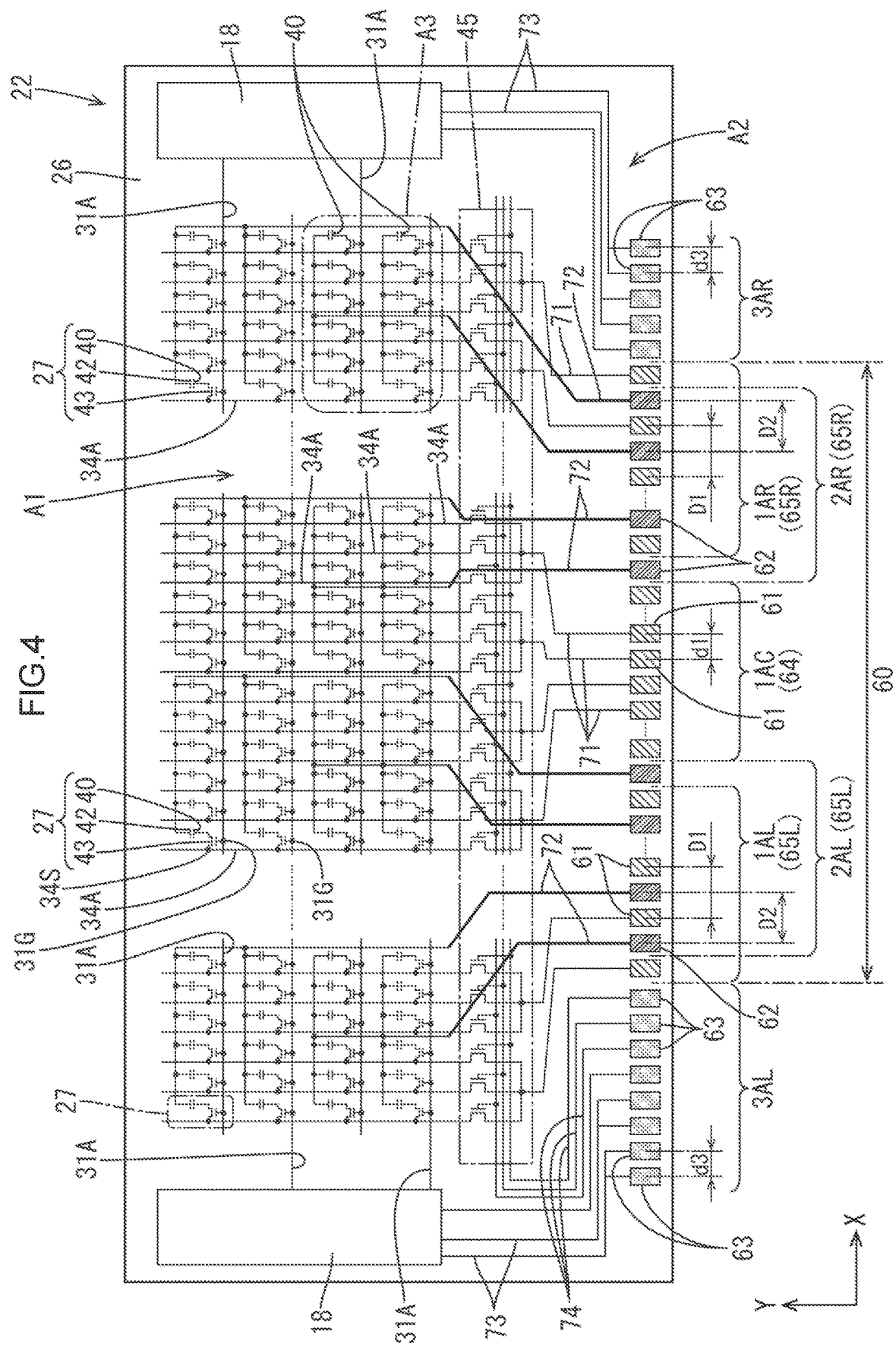
FIG. 4 is a plan view showing the active matrix substrate.

As shown in FIG. 4, on top of the glass substrate 26, which constitutes the active matrix substrate 22, the display region A1 is provided with a plurality of pixels 27 (pixel array) arrayed in a matrix along an X-axis direction (row direction) and the Y-axis direction (column direction). At both ends, respectively, of the X-axis direction on top of the glass substrate 26, gate drivers 18 are provided, respectively. Further, an RGB switch circuit 45 is provided between a region of formation of the plurality of pixels 27 and the terminals 61, 62, and 63.

Each of the pixels 27 includes a pixel electrode 40, a common electrode 42, and a TFT 43. The pixel electrode 40 is provided on top of the glass substrate 26, and a plurality of the pixel electrodes 40 are arrayed in a matrix along the X-axis direction (i.e. a first side direction of the glass substrate 26) and the Y-axis direction (i.e. a second side direction of the glass substrate 26). A plurality of the TFTs 43 (thin-film transistors, switching elements) are arrayed in a matrix along the X-axis direction and the Y-axis direction. The TFTs 43 are provided at places of intersection between the gate lines 31A and the source lines 34A, and the plurality of TFTs 43 are connected to the plurality of pixel electrodes 40, respectively. The TFTs 43 are driven in accordance with various types of signal that are supplied to the gate lines 31A and the source lines 34A, respectively, and as the TFTs 43 are driven, a predetermined voltage is applied to the pixel electrodes 40.

The common electrode 42 is a solid electrode, and a potential difference between the pixel electrode 40, which has a plurality of slits (not illustrated), and the common electrode 42 causes a fringe field (oblique field) including a component normal to a plate surface of the active matrix substrate 22 in addition to a component parallel to the plate surface of the active matrix substrate 22 to be generated between the common electrode 42 and the pixel electrode 40. As a result, utilizing the fringe field to control a state of alignment of the liquid crystal molecules contained in the liquid crystal layer 23 (see FIG. 1) makes it possible to display an image on the display region A1.

As shown in FIG. 4, each of the gate drivers 18 has a shape elongated in the Y-axis direction, is monolithically formed on top of the glass substrate 26, and has a control circuit for controlling the supply of output signals to the TFTs 43. The gate lines 31A, which extend along the Y-axis direction, are each connected to the gate drivers 18 on both sides. Further, a plurality of wires 73 are drawn out from each of the gate drivers 18. The terminals 63 (third terminals) are provided at ends of the wires 73 opposite to the gate drivers 18. That is, the terminals 63 are electrically connected to the gate electrodes 31G of the TFTs 43 via the gate drivers 18 and the gate lines 31A. The gate drivers 18 are supplied with control signals, for example, from the control circuit board 12 (see FIG. 1) via the terminals 63 and the wires 73.

It should be noted that although the present embodiment has illustrated a configuration in which the gate drivers 18 are placed at both ends, respectively, of the X-axis direction on top of the glass substrate 26, this is not intended to impose any limitation. For example a gate driver 18 may be placed only at one end in the X-axis direction. Further, the gate driver 18 that drives even-numbered ones of the gate lines 31A, which are placed in the Y-axis direction, may be disposed on one side in the X-axis direction, and the gate driver 18 that drives odd-numbered ones of the gate lines 31A may be disposed on the other side in the X-axis direction.

The RGB switch circuit 45 is monolithically formed on top of the glass substrate 26 like the gate drivers 18, and is formed in such a manner as to extend along a side (X-axis direction) around the pixel array. Three source lines 34A corresponding to red, green, and blue pixels 27, respectively, are connected to one wire 71 via the RGB switch circuit 45. The terminals 61 (first terminals) are provided at an end of the wire 71 (switching element wire) opposite to the RGB switch circuit 45. The wire 71 is a wire, provided on top of the glass substrate 26, for electrically connecting the terminals 61 to the plurality of TFTs 43 (source electrodes 34S), which are placed in the Y-axis direction, and a plurality of the wires 71 are provided in correspondence with a plurality of the terminals 61, respectively. It should be noted that the wires 71, which are drawn out from the RGB switch circuit 45, first extend toward the terminals 61 along the Y-axis direction, next extend in a direction tilted with respect to the Y axis, and then extend toward the terminals 61 along the Y-axis direction.

The RGB switch circuit 45 has a function of sorting, into each separate source line 34A, image signals contained in output signals that are supplied from the driver 17. This as a result makes it possible to perform an RGB three-primary color display by effecting variations in the transmittance of the pixels 27. It should be noted that although the present embodiment has illustrated a configuration in which one wire 71 is connected to three source lines 34A, this is not intended to impose any limitation. For example, one wire 71 may be allocated to two source lines 34A, or one wire 71 may be allocated to four source lines 34A.

According to the present embodiment, the liquid crystal panel 11 has a display function of displaying an image and a touch panel function (position input function) of detecting a position (input position) input by a user on the basis of an image that is displayed, and is integrated (by in-cell technology) with a touch panel pattern for fulfilling the touch panel function. This touch panel pattern adopts a so-called projection capacitive scheme, and a detection scheme of the touch panel pattern is a self-capacitance scheme. In the present embodiment, as shown in FIG. 2, the touch panel pattern is constituted by a plurality of the common electrodes 42 provided on top of the glass substrate 26. That is, the common electrodes 42 function as position detection electrodes. The plurality of common electrodes 42 are arrayed in a matrix along the X-axis direction and the Y-axis direction. It should be noted that the area of each of the common electrodes 42 is set to be larger in value than the area of each of the pixel electrodes 40 so that one common electrode 42 is placed opposite a plurality of pixel electrodes 40. It should be noted that an example of a region of placement of one common electrode 42 is indicated by sign A3 in FIG. 4.

Each of the common electrodes 42 is connected to one end of a wire 72 (common electrode wire) provided on top of the glass substrate 26. At the other end of the wire 72, a terminal 62 is provided. That is, a plurality of the wires 72 are configured to electrically connect a plurality of the terminals 62 to the plurality of common electrodes 42, respectively. A common voltage is applied to the common electrodes 42 via the terminals 62 and the wires 72.

Further, when a user of the liquid crystal display device 10 moves a finger (position input body; not illustrated) as a conductor toward a surface (display surface) of the liquid crystal panel 11, a capacitance is formed between the finger and a common electrode 42. This causes a capacitance detected at a common electrode 42 located close to the finger to be different from the capacitance of a common electrode 42 located away from the finger, thus making it possible to detect an input position on the basis of the difference. During control to detect an input position, the control circuit board 12 supplies the common electrodes 42 with a drive signal for detecting the input position and receives a detection signal for detecting the input position via the driver 17, the terminals 62, and the wires 72.

The number of common electrodes 42 that are placed (divided) is set as appropriate according to the resolving power of touch sensing and the size of a display screen. For example, in the case of a liquid crystal panel of a wide screen of 5 to 6 inches, the number of common electrodes 42 that are divided is set to approximately 500 to 600. The following description assumes that the number of common electrodes 42 that are placed is n. The wires 72, which are drawn out from the common electrodes 42, first extend toward the terminals 62 along the Y-axis direction, next extend in a direction tilted with respect to the Y axis, and then extend toward the terminals 62 along the Y-axis direction. Further, the wires 72 are disposed in such a manner as to overlap the pixel array in a Z-axis direction (i.e. a thickness direction of the active matrix substrate 22). For this reason, as shown in FIG. 3, the wires 72 are formed by a different conducting film from the gate conducting film 31 and the conducting film 34 (i.e. the source conducting film and the drain conducting film) and disposed at a different level (i.e. a higher level than the gate conducting film 31 and the conducting film 34).

Figure 5:
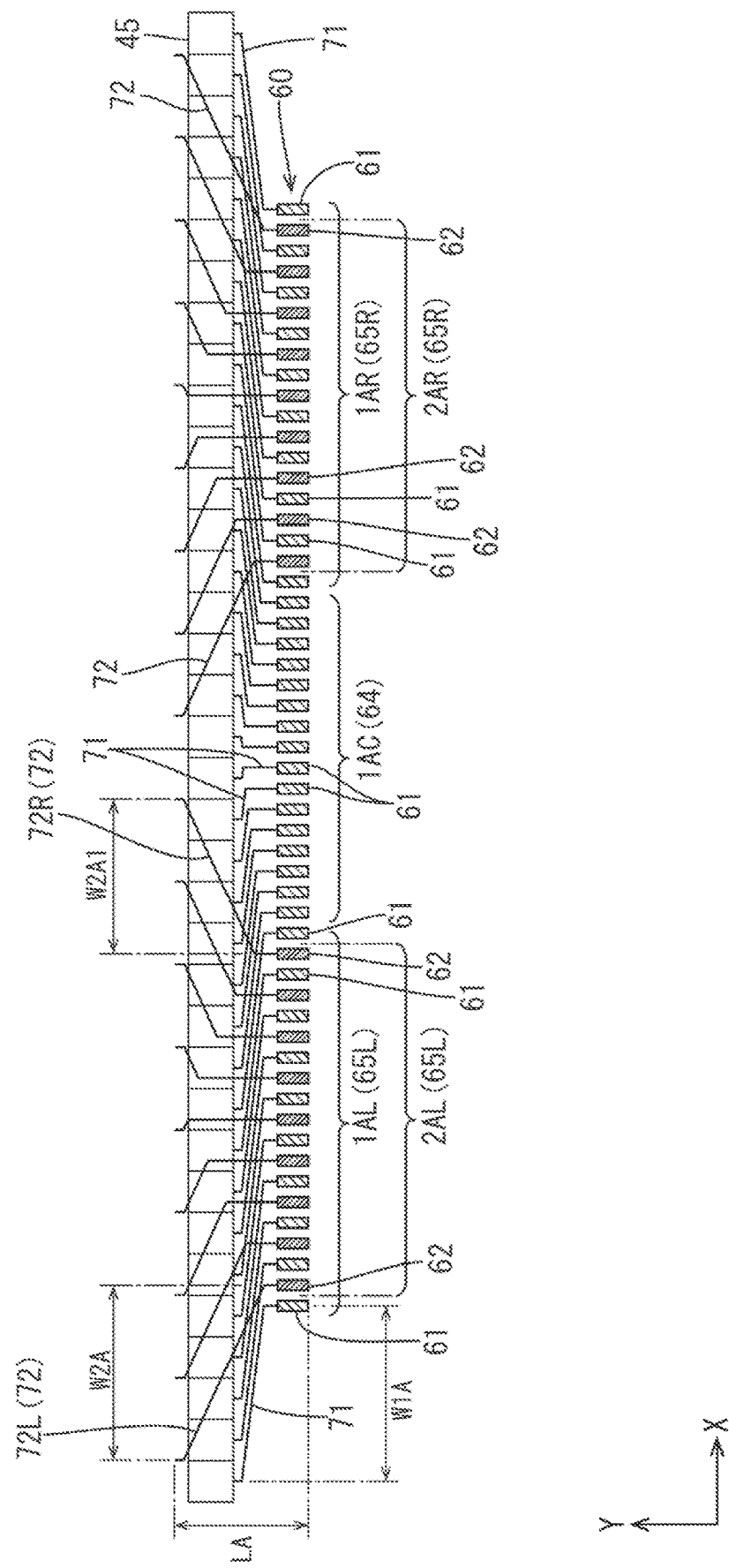
FIG. 5 is a plan view showing a mode of placement of terminals.
Figure 6:
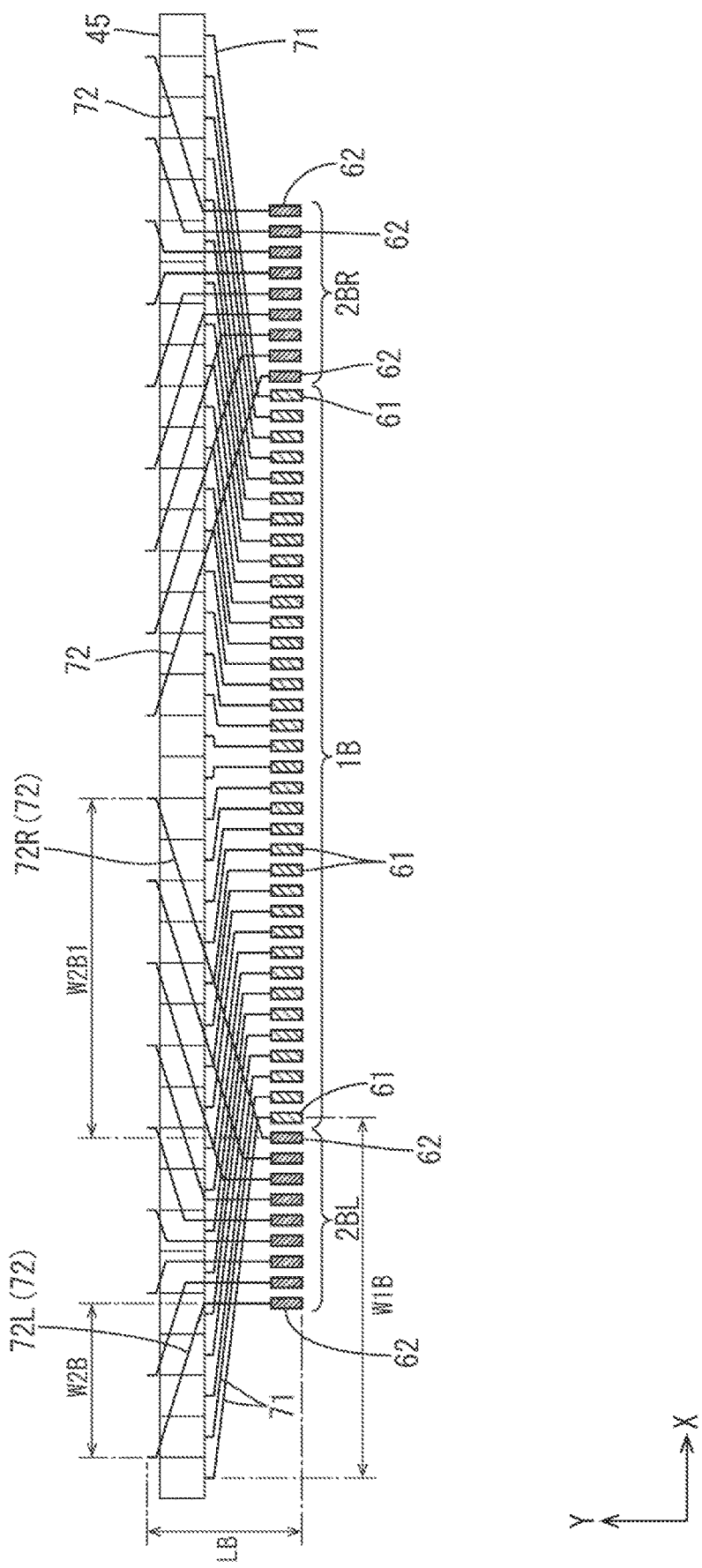
FIG. 6 is a plan view showing a mode of placement of terminals according to Comparative Example 1.

Next, a configuration of the wires 71, 72, and 73 and the terminals 61, 62, and 63 is described in detail. In the following description, a terminal group constituted by terminals is called "first terminal group", and a terminal group constituted by terminals 62 is called "second terminal group". Further, a terminal group constituted by terminals 63 is called "third terminal group". In the present embodiment, as shown in FIG. 4, a plurality of pixels 61, 62, and 63 are provided at one end of the Y-axis direction on top of the glass substrate 26, and are arrayed in a linear fashion along the X-axis direction. In a case where a terminal group constituted by a plurality of terminals 61 and 62 is a terminal group 60, the length of the terminal group 60 is set to be smaller in value than the length of a region of placement of the plurality of TFTs 43, the length of a region of placement of the plurality of common electrodes 42, and the length of a region of placement of the RGB switch circuit 45 in the X-axis direction. For this reason, as shown in FIG. 5, the plurality of wires 71 are formed to be narrowed down into a fan shape from the RGB switch circuit 45 toward first terminal groups (first terminal groups LAC, LAL, and LAR) constituted by the terminals 61, and the plurality of wires 72 are formed to be narrowed down into fan shapes from the plurality of common electrodes 42 toward second terminal groups 2AL and 2AR, respectively. It should be noted that the terminals 61, 62, and 63 are for example identical in shape and area to one another. It should be noted that FIG. 5 omits to illustrate the terminals 63.

As shown in FIG. 4, the terminal group 60 includes a center terminal group 64 that constitutes a central portion in the X-axis direction and end terminal groups 65L and 65R that constitute both end portions in the X-axis direction, respectively. The center terminal group 64 is constituted by a plurality of terminals 61 (first terminal group LAC) placed along the X-axis direction. The end terminal groups 65L and 65R are constituted by terminals 61 and 62. Specifically, the end terminal group 65L is constituted by a plurality of terminals 61 (first terminal group LAL) placed along the X-axis direction and a plurality of terminals 62 (second terminal group 2AL) placed along the X-axis direction. The end terminal group 65R is constituted by a plurality of terminals 61 (first terminal group LAR) placed along the X-axis direction and a plurality of terminals 62 (second terminal group 2AR) placed along the X-axis direction. The end terminal groups 65L and 65R are disposed in such a manner that the center terminal group 64 is interposed between the end terminal groups 65L and 65R in the X-axis direction.

The number of wires 71 is determined by the number of pixels 27 and how many source lines 34A are allocated to one wire 71 by the RGB switch circuit 45. A case of a portrait display on a liquid crystal panel for use in a mobile phone is illustrated here. In the case of a resolution of FHD (1080×1920), the number of wires 71 is usually 1080, and in the case of a resolution of WQHD (1440×2560), the number of wires 71 is usually 1440 or 2160. The following description assumes that the number of wires 71 is N. That is, the total number of terminals 61 is N. It should be noted that the wires 71 are constituted, for example, by the gate conducting film 31 or the conducting film 34.

As shown in FIG. 4, the first terminal group LAL is disposed on the left side of the first terminal group LAC, and the first terminal group LAR is disposed on the right side of the first terminal group LAC. The first terminal group LAC includes a plurality of terminals 61 arrayed at equal spacings with array pitches d1. The first terminal group LAL includes a plurality of terminals 61 arrayed at equal spacings with array pitches D1. An array pitch D1 is set, for example, to be twice as large as an array pitch d1. Further, the first terminal group LAC and the first terminal group LAL are adjacent to each other with a pitch of D1, and the first terminal group LAC and the first terminal group LAR are adjacent to each other with a pitch of d1 or D1. That is, the first terminal groups 1AL, 1AC, and 1AR can be regarded as an array of the total number N of terminals 61 with varying pitches halfway.

The numbers of wires 72 and terminals 62 are each equal to the number n of common electrodes 42. It should be noted that it is common that n<N, as N is 1080, 1440, or 2160 and n is 500 to 600 as mentioned above. The end terminal groups 65L and 65R each include a terminal 62 disposed between two terminals 61 adjacent to each other with an array pitch D1. The second terminal groups 2AL and 2AR, which constitute the end terminal groups 65L and 65R, respectively, each include a plurality of terminals 62 arrayed at equal spacings with array pitches D2. An array pitch D2 is set to be equal in value to an array pitch D1. That is, the end terminal groups 65L and 65R each include an alternate array of terminals 61 and 62. For ease of comprehension of a mode of placement of terminals 61 and 62, FIG. 5 illustrates a smaller number of terminals 61 and 62 than in reality and illustrates thirty-six terminals 61 and eighteen terminals 62.

As shown in FIG. 5, the plurality of wires 72 include a first group of wires 72 (half of the total number of wires 72) formed in such a manner as to be narrowed down (i.e. in such a manner as to converge) into a fan shape toward the second terminal group 2AL and a second group of wires 72 formed in such a manner as to be narrowed down into a fan shape toward the second terminal group 2AR. It should be noted that the wires 72 are disposed at a different level from the wires 71 on top of the glass substrate 26 so as to be prevented from interfering with the wires 71. Further, the wires 72 may be disposed at a different level from the wires 71 only in places where the wires 72 and 71 overlap. Further, the wires 72 is formed at a different level from the RGB switch circuit 45 and disposed to overlap the RGB switch circuit 45 in a plan view.

As shown in FIG. 4, the plurality of terminals 63 constitute third terminal groups 3AL and 3AR disposed on both sides, respectively, of the terminal group 60 in the X-axis direction. That is, when one side of the glass substrate 26 is seen from the left in FIG. 4, the third terminal group 3AL, the terminal group 60 (end terminal group 65L, center terminal group 64, end terminal group 65R), and the third terminal group 3AR are arrayed in this order. As shown in FIG. 4, in the X-axis direction, the length of the terminal group 60 is smaller than the length of the pixel array constituted by the plurality of pixels 27. For this reason, even in a case where the third terminal groups 3AL and 3AR are disposed on both sides of the terminal group 60, the active matrix substrate 22 can be prevented from becoming larger in length in the X-axis direction.

Although the terminals 63 are terminals connected to the gate lines 31A of the pixels 27, this is not intended to limit the uses of the terminals 63. For example, as shown in FIG. 2, the terminals 63 may be terminals for wires 74 pertaining to the control of the RGB switch circuit 45. Further, the terminals 63 may be replaced by placing terminals (not illustrated) for use in inspection of the liquid crystal panel 11 or providing a patterning of a mark or product name for manufacturing management of a product. Further, in a case where the terminals 63 are used as terminals for supplying the gate drivers 18 with power-supply electric power, a power supply may be electrically connected across two or more terminals 63.

Next, effects of the present embodiment are described. In such a case as the present embodiment where from each of a plurality of common electrodes (or switching elements) placed in the X-axis direction, a wire is extended with respect to each terminal of a terminal group that is relatively small in length in the X-axis direction, a plurality of the wires are disposed in such a manner as to converge toward the terminal group. Note here that since an increase in degree of convergence (amount of narrowing down) of the wires leads to an increase in length of the wires in the X-axis direction, a larger number of wires are placed in the Y-axis direction. When a large number of wires are placed in the Y-axis direction, there is an increase in space of placement of the wires in the Y-axis direction due to the width of each wire and the spacing between adjacent wires.

In the present embodiment, as shown in FIG. 5, the end terminal groups 65L and 65R, which constitute both side portions of the terminal group 60 in the X-axis direction, are each configured to include terminals 62 each disposed between two adjacent terminals 61. That is, the end terminal groups 65L and 65R are each configured to include a mixture of terminals 61 and 62. As a result, the length of the plurality of terminals 61 in the X-axis direction (i.e. the length of a combination of the first terminal groups 1AL, 1AC, and 1AR) and the length of the plurality of terminals 62 in the X-axis direction (i.e. the length of each of the second terminal groups 2AL and 2AR) can be made larger than in a case where the terminal group 60 has its central portion constituted solely by a plurality of terminals 61 and both end portions of the terminal group are each constituted solely by a plurality of terminals 62 (see the terminal groups of FIG. 6, which will be described in detail later). That is, the degree of convergence of a plurality of wires 71 (amount of narrowing down W1A of FIG. 5) and the degrees of convergence of a plurality of wires 72 (amounts of narrowing down W2A and W2A1 of FIG. 5) can each be made smaller. This as a result makes it possible to further reduce the space of placement of the wires 71 and 72 in the Y-axis direction (Y-axis direction frame size LA), thus making it possible to make the active matrix substrate 22 have a narrower frame.

Further, as shown in FIG. 4, the third terminal groups 3AL and 3AR are included that are provided on top of the glass substrate 26, disposed on both sides, respectively, of the terminal group 60 in the X-axis direction, and each constituted by a plurality of terminals 63 placed along the X-axis direction. In the present embodiment, the length of the terminal group 60 in the X-axis direction is set to be smaller in value than the length of the region of placement of the plurality of TFTs 43 and the length of the region of placement of the plurality of common electrodes 42. This makes it possible to secure a space in which to place terminals on both sides of the terminal group 60 in the X-axis direction. This makes it possible to prevent the active matrix substrate 22 from becoming larger in the X-axis direction in a case where the terminals 63, which are terminals other than the terminals 61 and 62, are disposed.

Further, the wires 71 are electrically connected to the source electrodes 34S of the TFTs 43, and the terminals 63 are electrically connected to the gate electrodes 31G of the TFTs 43. Such a configuration allows the terminals 61, 62, and 63 connected to the TFTs 43 and the common electrodes 42 to be arrayed along the X-axis direction, thus making it possible to further reduce the space of placement of the terminals 61, 62, and 63 in the Y-axis direction.

Next, the effects of the present embodiment are described in detail by illustrating Comparative Examples 1 to 5. Comparative Examples 1 to 5 are different in mode of placement of terminals 61 and 62 from the present embodiment and identical in other respects to the present embodiment. In Comparative Examples 1 to 5, the total number of terminals 61 and the total number of terminals 62 are equal to those of the present embodiment. Further, FIGS. 6 to 10, which show Comparative Examples 1 to 5, omit to illustrate terminals 63. In Comparative Example 1 shown in FIG. 6, a first terminal group 1B constituted by a plurality of terminals is provided, and second terminal groups 2BL and 2BR each constituted by a plurality of terminals 62 are disposed on both sides, respectively, of the first terminal group 1B in the X-axis direction. The plurality of terminals 61 and 62 are arrayed at equal spacings. The plurality of wires 71 extend in such a manner as to be narrowed down from the RGB switch circuit 45 toward the first terminal group 1B, and exhibit a fan-shaped appearance as a whole. The plurality of wires 72 include a first group of wires 72 formed in such a manner as to be narrowed down into a fan shape toward the second terminal group 2BL and a second group of wires 72 formed in such a manner as to be narrowed down into a fan shape toward the second terminal group 2BR.

In the X-axis direction, the length of the first terminal group 1B is smaller than the length of the first terminal groups (i.e. the length of a combination of the first terminal groups LAL, LAC, and LAR) of the present embodiment. In other words, the present embodiment includes terminals 61 disposed at both ends of the terminal group 60. For this reason, the amount of narrowing down W1B of wires 71 in Comparative Example 1 is larger than the amount of narrowing down W1A (see FIG. 5) of wires 71 in the present embodiment. The term "amount of narrowing down of wires" here refers to the length in the X-axis direction of the outermost ones in the X-axis direction of a plurality of wires extending in such a manner as to form a fan shape toward one terminal group. A larger amount of narrowing down of wires means that a larger number of wires are placed in the Y-axis direction, so that there is a larger space of placement of wires in the Y-axis direction.

It should be noted that of a plurality of wires 71 extending toward one terminal group, the leftmost and rightmost wires 71 may be given signs 71L and 71R, respectively, to be distinguished from the other wires 71. Further, of a plurality of wires 72 extending toward one terminal group, the leftmost and rightmost wires 72 are given signs 72L and 72R, respectively, to be distinguished from the other wires 72.

In the X-axis direction, the length of the second terminal group 2BL is smaller than the length of the second terminal group 2AL of the present embodiment. For this reason, while the amount of narrowing down W2B of wires 72L in Comparative Example 1 is substantially equal to the amount of narrowing down W2A of wires 72L in the present embodiment, the amount of narrowing down W2B1 of wires 72R in Comparative Example 1 is obviously larger than the amount of narrowing down W2A1 of wires 72R in the present embodiment. Thus, Comparative Example 1 is larger in amount of narrowing down of both wires 71 and 72 than the present embodiment. That is, under the constraint of wires 71 and 72, the Y-axis direction frame size LB of Comparative Example 1 is larger than the Y-axis direction frame size LA of the present embodiment.

Figure 7:
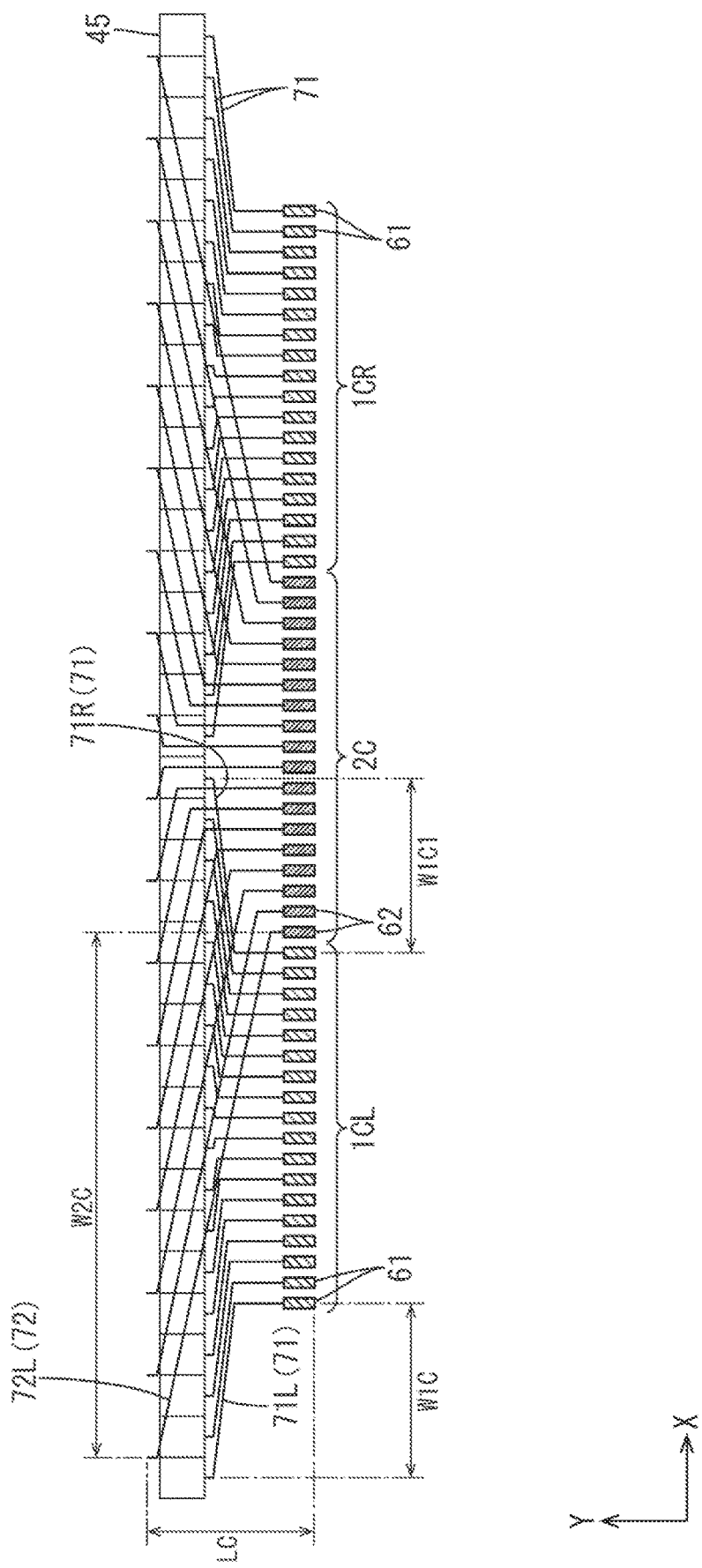
FIG. 7 is a plan view showing a mode of placement of terminals according to Comparative Example 2.

In Comparative Example 2 shown in FIG. 7, a second terminal group 2C constituted by a plurality of terminals 62 is provided, and first terminal groups 1CL and 1CR each constituted by a plurality of terminals 61 are disposed on both sides, respectively, of the second terminal group 2C in the X-axis direction. The plurality of terminals 61 and 62 are arrayed at equal spacings. Of the plurality of wires 71, a group of half of the wires 71 is formed in such a manner as to be narrowed down into a fan shape toward the first terminal group 1CL, and a group of the remaining wires 71 is formed in such a manner as to be narrowed down into a fan shape toward the first terminal group 1CR. The plurality of wires 72 extend in such a manner as to be narrowed down toward the second terminal group 2C, and exhibit a fan-shaped appearance as a whole.

The amount of narrowing down W1C of wires 71L in Comparative Example 2 is substantially equal to the amount of narrowing down W1A of wires 71 in the present embodiment. Further, the amount of narrowing down W1C1 of wires 71R in Comparative Example 2 takes on substantially the same value as or a slightly larger value than the amount of narrowing down W1C. Further, in the present embodiment, the second terminal groups 2AL and 2AR are disposed at first and second end sides, respectively, of the terminal group 60. On the other hand, in Comparative Example 2, the second terminal group 2C is disposed on a center side of the terminal group. For this reason, the amount of narrowing down W2C of wires 72L in Comparative Example 2 is obviously larger than the amount of narrowing down W2A of wires 72L in the present embodiment. As a result of this, under the constraint of wires 72, the Y-axis direction frame size LC is larger than the Y-axis direction frame size LA of the present embodiment.

Figure 8:
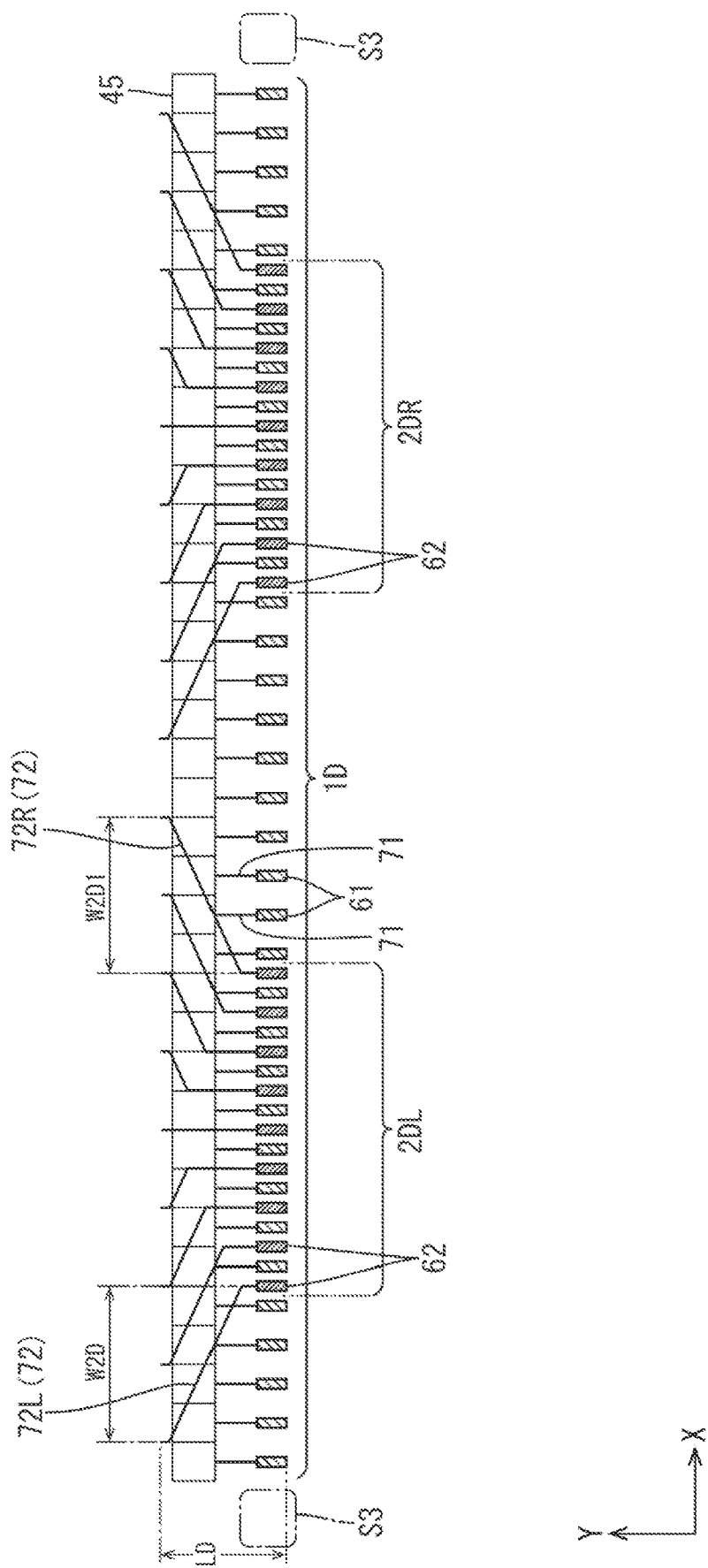
FIG. 8 is a plan view showing a mode of placement of terminals according to Comparative Example 3.

In Comparative Example 3 shown in FIG. 8, a first terminal group 1D constituted by a plurality of terminals 61 is disposed in a region that is substantially equal in length to the region of placement of the RGB switch circuit 45 in the X-axis direction. The plurality of terminals 61 are arrayed at equal spacings with array pitches within each of which one terminal 62 can be disposed. In a place on the first terminal group 1D that is closer to the left than the center, a terminal 62 is disposed between adjacent terminals 61, and a second terminal group 2DL is constituted by a plurality of the terminals 62. In a place on the first terminal group 1D that is closer to the right than the center, a terminal 62 is disposed between adjacent terminals 61, and a second terminal group 2DR is constituted by a plurality of the terminals 62. It should be noted that since the total number of terminals 62 is smaller than the total number of terminals 61, no terminal 62 is disposed between adjacent terminals 61 in a place other than the second terminal groups 2DL and 2DR. The plurality of wires 71 extend toward the first terminal group 1D along the Y-axis direction from the RGB switch circuit 45. The plurality of wires 72 include a first group of wires 72 formed in such a manner as to be narrowed down into a fan shape toward the second terminal group 2DL and a second group of wires 72 formed in such a manner as to be narrowed down into a fan shape toward the second terminal group 2DR.

In Comparative Example 3, the wires 71, which extend along the Y-axis direction, do not affect the Y-axis direction frame size LD. Further, the amount of narrowing down W2D of wires 72L in Comparative Example 3 is substantially equal to the amount of narrowing down W2A of wires 72L in the present embodiment, and the amount of narrowing down W2D1 of wires 72R in Comparative Example 3 is substantially equal to the amount of narrowing down W2A1 of wires 72R in the present embodiment. For this reason, the Y-axis direction frame size LC of Comparative Example 3 is substantially equal to the Y-axis direction frame size LA of the present embodiment. However, in Comparative Example 3, the first terminal group 1D is disposed in a region that is substantially equal in length to the region of placement of the RGB switch circuit 45 in the X-axis direction. This makes it necessary to place the terminals 63 in regions S3 on both sides of the first terminal group 1D. As a result of this, the configuration of Comparative Example 3 results in a larger space of placement of the terminals 61, 62, and 63 in the X-axis direction than the configuration of the present embodiment, thus making it difficult to make the active matrix substrate 22 have a narrower frame.

Figure 9:
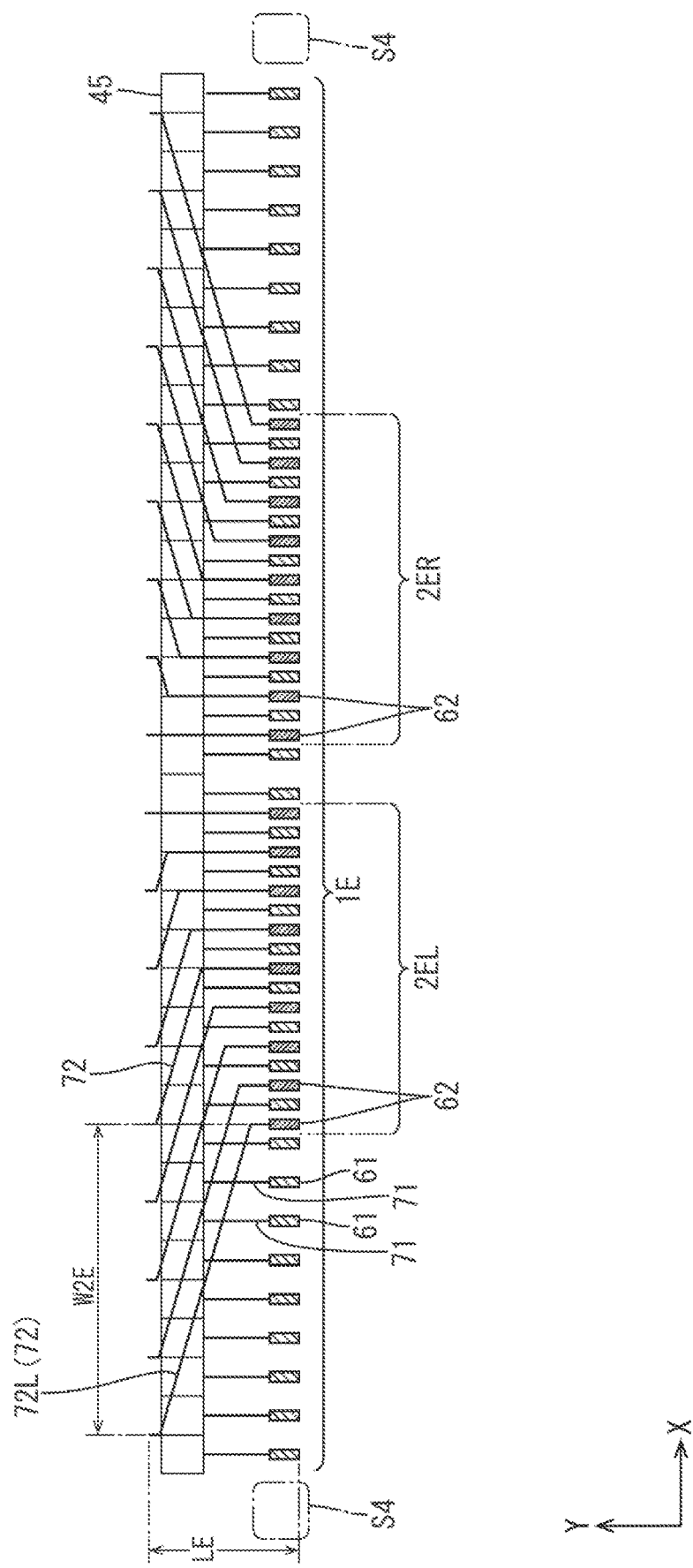
FIG. 9 is a plan view showing a mode of placement of terminals according to Comparative Example 4.

In Comparative Example 4 shown in FIG. 9, a first terminal group 1E constituted by a plurality of terminals 61 is disposed in a region that is substantially equal in length to the region of placement of the RGB switch circuit 45 in the X-axis direction. Comparative Example 4 is the same as Comparative Example 3 in that second terminal groups 2EL and 2ER are constituted by terminals 62 each disposed between adjacent terminals 61 but is different from Comparative Example 3 in that second terminal groups 2EL and 2ER are disposed closer to the center of the first terminal group 1E than the second terminal groups 2DL and 2DR of Comparative Example 3.

In Comparative Example 4, the plurality of wires 71 extend toward the first terminal group 1E along the Y-axis direction from the RGB switch circuit 45. The plurality of wires 72 include a first group of wires 72 formed in such a manner as to be narrowed down into a fan shape toward the second terminal group 2EL and a second group of wires 72 formed in such a manner as to be narrowed down into a fan shape toward the second terminal group 2ER. That is, the plurality of wires 72 are formed in such a manner as to be narrowed down into a fan shape toward the second terminal groups 2EL and 2ER. The amount of narrowing down W2E of wires 72L in Comparative Example 4 is larger than the amount of narrowing down W2A of wires 72L in the present embodiment. That is, Comparative Example 4 is under the constraint of wires 72, the Y-axis direction frame size LE is larger than the Y-axis direction frame size LA of the present embodiment. Further, the configuration of Comparative Example 4 makes it necessary to place the terminals 63 in regions S4 on both sides of the first terminal group 1E, as is the case with the configuration of Comparative Example 3. As a result, the configuration of Comparative Example 4 results in a larger space of placement of the terminals 61, 62, and 63 in the X-axis direction than the configuration of the present embodiment, thus making it difficult to make the active matrix substrate 22 have a narrower frame.

Figure 10:
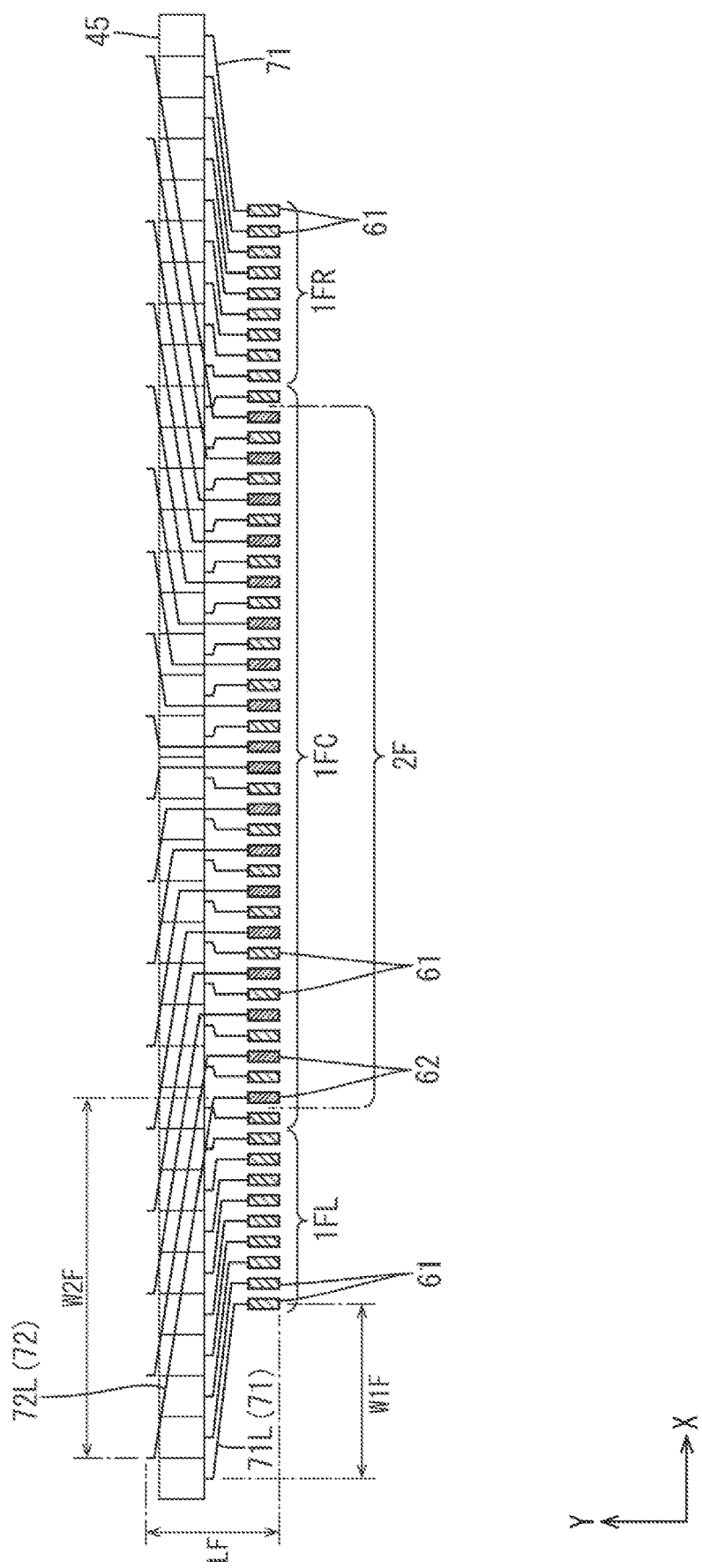
FIG. 10 is a plan view showing a mode of placement of terminals according to Comparative Example 5.

In Comparative Example 5 shown in FIG. 10, a first terminal group 1FC is disposed on a center side, and first terminal groups 1FL and 1FR are disposed on both sides, respectively. The array pitch between terminals 61 of the first terminal group 1FC is set to be twice as large as the array pitch between terminals 61 of the first terminal groups 1FL and 1FR, and terminals 62 of a second terminal group 2F are each disposed between terminals 61 of the first terminal group 1FC. The plurality of wires 71 are formed in such a manner as to be narrowed down into a fan shape toward the first terminal groups 1FL, 1FC, and 1FR from the RGB switch circuit 45. The plurality of wires 72 are formed in such a manner as to be narrowed down into a fan shape toward the second terminal group 2F.

The amount of narrowing down W1F of wires 71L in Comparative Example 5 is equal to the amount of narrowing down W1A of wires 71L in the present embodiment. Further, in Comparative Example 5, the outermost terminals 62 are disposed inside the first terminal groups 1FL and 1FR, respectively. On the other hand, in the present embodiment, the outermost terminals 62 are disposed near both ends, respectively, of the terminal group 60. For this reason, the amount of narrowing down W2F of wires 72 (see wires 72L) in Comparative Example 5 is larger than the amount of narrowing down W2A of wires 72 (see wires 72L) in the present embodiment. For this reason, under the constraint of wires 72, the Y-axis direction frame size LF of Comparative Example 5 is larger than the Y-axis direction frame size LA of the present embodiment.

As described above, the configuration of the present embodiment can make the amount(s) of narrowing down of wires 71 and/or wires 72 and the Y-axis direction frame size LA smaller than the configurations of Comparative Examples 1, 2, and 5. Further, the configuration of the present embodiment can make the X-axis direction frame size smaller than the configurations of Comparative Examples 3 and 4.

Thus, the present embodiment can make the outer dimensions of the glass substrate 26 smaller. This makes it possible to increase the number of glass substrates 26 that can be manufactured from one mother substrate, thus making it possible to reduce manufacturing cost. Further, since the frame size of the liquid crystal panel 11 can be made smaller, a reduction in the degree of freedom of design of an electric apparatus including the liquid crystal panel 11 can be prevented.

It should be noted that in the present embodiment, the driver 17 may be COF-mounted on top of the flexible substrate 13, and in the case of COF mounting, the driver 17 is not mounted directly on the active matrix substrate 22 but is installed behind the active matrix substrate 22. Accordingly, a space in which to place terminals needs only be secured at a peripheral end (non-display region A2) of the active matrix substrate 22. This, combined with the effects of the aforementioned mode of placement of terminals 71, 72, and 73, makes it possible to make the active matrix substrate 22 to have an even smaller frame. Further, in the case of COF mounting, the pitch between terminals provided in the active matrix substrate 22 does not need to be equal to the pitch between output terminals of the driver 17; therefore, the terminal pitches can be set according to the specifications (such as the screen size) of the active matrix substrate 22. This makes it possible, for example, to set to wider terminal pitches. In this respect, too, COF mounting is a preferred configuration in term of making a narrower frame. It should be noted that in the case of a special configuration suitable to making a narrower frame, such as an alternate arrangement of terminals, there is concern that the driver 17 may become larger in size. In particular, in the case of COF mounting, there occurs such inconvenience that the frame of the active matrix substrate 22 becomes larger for the large-sized driver 17 to be mounted. However, even when COF mounting results in an increase in size of the driver 17, the frame of the active matrix substrate can be prevented from becoming larger due to the driver 17.

Second Embodiment

Figure 11:
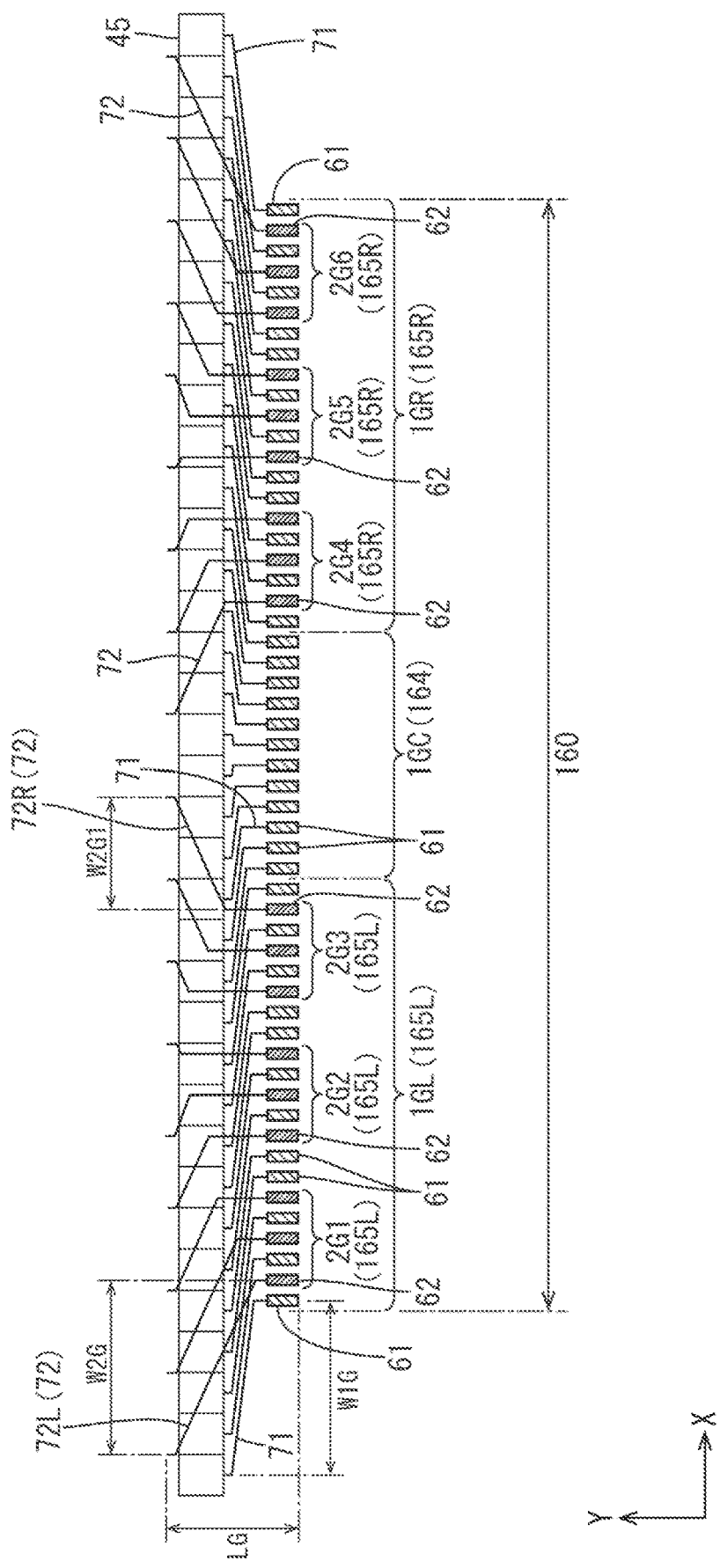
FIG. 11 is a plan view showing a mode of placement of terminals according to a second embodiment.

Next, a second embodiment of the present invention is described with reference to FIG. 11. The present embodiment is different in mode of placement of terminals 61 and 62 from the first embodiment. It should be noted that a repeated description is omitted by assigning the same signs to components which are the same as those of the foregoing embodiment. In the present embodiment, a terminal group 160 constituted by terminals 61 and 62 are constituted by a center terminal group 164 and end terminal groups 165L and 165R. The present embodiment illustrates thirty-six terminals 61 and eighteen terminals 62, as is the case with the foregoing embodiment. The center terminal group 164 is constituted by a plurality of terminals 61 placed along the X-axis direction. The end terminal groups 165L and 165R are each disposed to include a mixture of a plurality of terminals 61 and a plurality of terminals 62.

The end terminal group 165L is constituted by a first terminal group 1GL and three second terminal groups 2G1, 2G2, and 2G3. The array pitch between terminals 61 in the first terminal group 1GL is larger than the array pitch between terminals 61 in the center terminal group 164, and terminals 62 are each disposed between adjacent terminals 61. Note, however, that two terminals 61 are successively disposed between adjacent ones of the second terminal groups 2G1, 2G2, and 2G3 and the two terminals 61 have the same array pitch as the array pitch between terminals 61 in the center terminal group 164. In the end terminal group 165R, the array pitch between terminals 61 in the first terminal group 1GR is larger than the array pitch between terminals 61 in the center terminal group 164, and terminals 62 are each disposed between adjacent terminals 61. Note, however, that two terminals 61 are successively disposed between adjacent ones of second terminal groups 2G4, 2G5, and 2G6 and the two terminals 61 have the same array pitch as the array pitch between terminals 61 in the center terminal group 164. Thus, the end terminal groups 165L and 165R of the present embodiment each include a mixture of a portion in which a terminal 62 is disposed between two adjacent terminals 61 and a portion in which two terminals 61 are successively placed.

The plurality of wires 71 are drawn out from the RGB switch circuit 45 toward the first terminal groups 1GL, 1GC, and 1GR to form a fan shape as a whole. The plurality of wires 72 include a first group of wires 72 drawn out toward the second terminal groups 2G1, 2G2, and 2G3 to form a fan shape as a whole. The plurality of wires 72 include a second group of wires 72 drawn out toward the second terminal groups 2G4, 2G5, and 2G6 to form a fan shape as a whole. The amount of narrowing down W1G of wires 71 is equal to the amount of narrowing down W1A of wires 71 in the first embodiment. The amount of narrowing down W2G of wires 72L is equal to the amount of narrowing down W2A of wires 72L in the first embodiment. Due to the successive disposition of two terminals 61 between adjacent ones of the second terminal groups 2G1, 2G2, and 2G3, the amount of narrowing down W2G1 of wires 72R takes on a smaller value than the amount of narrowing down W2A1 of wires 72R in the first embodiment. It should be noted that since the number of wires 71 is larger than the number of wires 72, the Y-axis direction frame size LG is more easily affected. In the present embodiment, since the frame size LG is constrained by the wires 71 and the amount of narrowing down W1G of the wires 71 is equal to the amount of narrowing down W1A of the wires 71 in the first embodiment, the frame size LG is equal to the frame size LA of the first embodiment.

Other Embodiment

The present invention is not limited to the embodiments described above with reference to the drawings. The following embodiments may be included in the technical scope of the present invention.

(1) The materials of the conducting films and the insulating films are not limited to the materials illustrated in the foregoing embodiments but are subject to change as appropriate.

(2) Although the foregoing embodiments have shown an example in which the semiconductor film 33 of a TFT 43 is made of low-temperature polysilicon, this is not intended to impose any limitation. The material of the semiconductor film 33 is subject to change as appropriate, and the semiconductor film 33 may be made, for example, of amorphous silicon or an In—Ga—Zn—O semiconductor.

(3) Although the foregoing embodiments have illustrated a configuration in which the plurality of terminals 61, 62, and 63 are placed in a linear fashion along the X-axis direction, this is not intended to impose any limitation. The plurality of terminals 61, 62, and 63 need only be placed along the X-axis direction and, for example, may be arrayed (in a staggered arrangement) in such a manner that terminals adjacent to each other in the X-axis direction are slightly displaced from each other in the Y-axis direction.

(4) Although the foregoing embodiments have illustrated a configuration in which the plurality of wires 72 are divided into two wire groups each forming a fan shape, this is not intended to impose any limitation. This configuration may be replaced by a configuration in which the plurality of wires 72 are divided into three or more wire groups each forming a fan shape.

(5) Although the foregoing embodiments have illustrated a configuration in which the terminals 61 and the source lines 34A are connected to each other via the RGB switch circuit 45, this is not intended to impose any limitation. This configuration may be replaced by a configuration in which no RGB switch circuit 45 is included and the source lines 34A and the terminals 61 are directly connected to each other. That is, there may be provided as many terminals 61 as the source lines 34A.

(6) Although the foregoing embodiments take such a form that the terminals 61 and 62 and the wires 71 and 72 are placed symmetrically with respect to the Y-axis, this is not intended to impose any limitation. For example, the pitch between terminals in the left half of FIG. 5 and the pitch between terminals in the right half of FIG. 5 may be different from each other, and the wires 71 and 72 may be placed asymmetrically.

EXPLANATION OF SYMBOLS

11: Liquid crystal panel (display panel)
21: CF substrate (counter substrate)
22: Active matrix substrate
26: Glass substrate (substrate)
31G: Gate electrode
34S: Source electrode
40: Pixel electrode
42: Common electrode
43: TFT (switching element)
60: Terminal group
61: Terminal (first terminal)
62: Terminal (second terminal)
63: Terminal (third terminal)
64, 164: Center terminal group
65R, 65L, 165R, 165L: End terminal group
71: Wire (switching element wire)
72: Wire (common electrode wire)
3AL, 3AR: Third terminal group

The invention claimed is:

1. An active matrix substrate comprising:
a substrate;
pixel electrodes disposed on the substrate and arrayed in a matrix along a row direction and a column direction;
switching elements arranged in the row direction and the column direction on the substrate and connected to the pixel electrodes, respectively;
common electrodes arranged in the row direction and the column direction on the substrate;
a row of terminals disposed in an end section of the substrate with respect to the column direction and including a group of wire terminals and a group of common wire terminals that are arranged in the row direction, the group of wire terminals including two end wire terminals disposed at two ends of the group of wire terminals, the two end wire terminals including a first end wire terminal and a second end wire terminal;
a group of connection wires arranged in the row direction on the substrate corresponding to the wire terminals, respectively, and electrically connecting the wire terminals and the switching elements, the connection wires including first end portions and second end portions, respectively, the first end portions extending from the wire terminals, respectively, and the second end portions being opposite end portions from the first end portions, the group of connection wires including two end connection wires including a first end connection wire that extends from the first end wire terminal and a second end connection wire that extends from the second end wire terminal, the first end wire terminal being away from the second end wire terminal with a first distance, the second end portion of the first end connection wire being away from the second end portion of the second end connection wire with a second distance, and the first distance being smaller than the second distance; and common wires arranged in the row direction on the substrate and electrically connecting the common wire terminals and the common electrodes, respectively, the common wires including third end portions that extend from the common wire terminals and fourth end portions that extend from the common electrodes, respectively, wherein the common wire terminals include a first set and a second set, the first set including two common wire terminals that are adjacent to each other at a first set interval and the second set including another common wire terminals that are adjacent to each other at a second set interval, the second set interval is smaller than the first set interval, the second set is closer to one of two ends of the row of terminals than the first set is, the third end portions of two common wires of the common wires extend in a first direction from the two common wire terminals of the second set and the first end portion of one of the connection wires extends in the first direction from one of the wire terminals, and the first end portion of the one of the connection wires is disposed between the third end portions of the two common wires.

2. The active matrix substrate according to claim 1, wherein the common electrodes are included in columns including at least a first column and a second column that are adjacent to each other in the row direction, one of the two common wire terminals included in the first set is electrically connected to one of the common electrodes included in the first column, and another one of the two common wire terminals included in the first set is electrically connected to one of the common electrodes included in the second column.

3. The active matrix substrate according to claim 1, wherein the common wire terminals further include a third set including other two common wire terminals that are adjacent to each other at a third set interval and the third set interval is smaller than the first set interval and different from the second set interval.

4. The active matrix substrate according to claim 1, wherein the row of terminals includes the first set in a middle section of the row of terminals.

5. The active matrix substrate according to claim 1, wherein the second set includes second sets that are arranged in the row direction.

6. The active matrix substrate according to claim 5, wherein one wire terminal of the wire terminals is disposed in the second set interval of each of two adjacent second sets of the second sets, and a first interval between the one wire terminal disposed in the second set interval of one of the two adjacent second sets and the one wire terminal disposed in the second set interval of another one of the two adjacent second sets is equal to the second set interval.

7. The active matrix substrate according to claim 1, wherein at least two wire terminals of the wire terminals are disposed in the first set interval and at least one wire terminal of the wire terminals is disposed in the second set interval, and the number of the wire terminals disposed in the first set interval is greater the number of the wire terminal disposed in the second space.

8. The active matrix substrate according to claim 7, wherein the second set includes second sets that are arranged in the row direction, the one wire terminal is disposed in the second set interval of each of two adjacent second sets of the second sets, and a first interval between the one wire terminal disposed in the second set interval of one of the two adjacent second sets and the one wire terminal disposed in the second set interval of another one of the two adjacent second sets is twice as a second interval between the at least two wire terminals that are disposed in the first set interval.

9. The active matrix substrate according to claim 1, wherein the wire terminals are greater in number than the common wire terminals.

10. The active matrix substrate according to claim 1, the wire terminals and the common wire terminals included in the row of terminals are not overlapped with each other in the column direction.

11. The active matrix substrate according to claim 1, wherein the common wires are included in a layer different from a layer including the connection wires.

12. The active matrix substrate according to claim 11, wherein one of the common wires overlaps a portion of one of the connection wires.

13. The active matrix substrate according to claim 11, further comprising an RGB switch circuit with which the connection wires are electrically connected to the switching elements, wherein one of the common wires overlaps a portion of the RGB switch circuit.

14. The active matrix substrate according to claim 11, wherein the connection wires are disposed in a first area of the substrate and the first area is narrowed down into a fan shape from the second end portions to the first end portions.

15. The active matrix substrate according to claim 11, wherein the first end portions of the connection wires are arranged at a first arrangement interval in the row direction, the second end portions of the connection wires are arranged at a second arrangement interval in the row direction, the first arrangement interval is smaller than the second arrangement interval, and the connection wires include middle portions that extend from the first end portions to the second end portions and inclined with respect to the first direction.

16. The active matrix substrate according to claim 11, wherein the common wires are disposed in a second area of the substrate and the second area is narrowed down into a fan shape from the fourth end portions to the third end portions.

17. The active matrix substrate according to claim 16, wherein the common wires are grouped into at least two groups that include a first group including the common wires disposed in the second area and a second group including another common wires disposed in a third area of the substrate.

18. The active matrix substrate according to claim 11, wherein the third end portions of the common wires are arranged at a third arrangement interval in the row direction, the fourth end portions of the common wires are arranged at a fourth arrangement interval in the row direction, the third arrangement interval is smaller than the fourth arrangement interval, and the common wires include middle portions that extend from the third end portions to the fourth end portions and inclined with respect to the first direction.

19. A display panel comprising:

the active matrix substrate according to claim 1; and an opposed substrate that is disposed opposite the active matrix substrate.

20. The active matrix substrate according to claim 1, wherein the one of the wire terminals is disposed between the two common wire terminals of the second set.

21. The active matrix substrate according to claim 1, wherein the two common wire terminals of the first set are adjacent to each other in the row direction at the first set interval and the two common wire terminals of the second set are adjacent to each other in the row direction at the second set interval.

22. The active matrix substrate according to claim 21, wherein the two common wire terminals of the first set and the other two common wire terminals of the second set are included in the row of terminals.

\* \* \* \* \*